United States Patent [19]

Walsh

[11] 3,979,239

[45] Sept. 7, 1976

[54] PROCESS FOR CHEMICAL-MECHANICAL POLISHING OF III-V SEMICONDUCTOR MATERIALS

[75] Inventor: Robert J. Walsh, Ballwin, Mo.

[73] Assignee: Monsanto Company, St. Louis, Mo.

[22] Filed: Dec. 30, 1974

[21] Appl. No.: 537,478

[52] U.S. Cl. .................................. 156/4; 29/580; 156/6; 156/17; 252/79.2; 252/79.4
[51] Int. Cl.² ................................ H01L 21/304
[58] Field of Search .............. 156/4, 6, 17, 345; 252/79.2, 79.4; 29/580, 583; 106/3

[56] References Cited
UNITED STATES PATENTS

| | | |
|---|---|---|
| 3,342,652 | 9/1967 | Reisman et al. .................. 156/345 |
| 3,615,955 | 10/1971 | Regh et al. ...................... 156/345 |
| 3,775,201 | 11/1973 | Basi et al. ........................ 156/17 |
| 3,791,948 | 2/1974 | Dixon et al. ..................... 156/17 |
| 3,869,323 | 3/1975 | Basi ................................. 156/17 |
| 3,869,324 | 3/1975 | Basi et al. ........................ 156/17 |

Primary Examiner—William A. Powell
Assistant Examiner—Jerome W. Massie
Attorney, Agent, or Firm—Peter S. Gilster

[57] ABSTRACT

Method for combined chemical-mechanical polishing of III - V semiconductor planar surfaces by applying a weak aqueous hydrochloric acid solution in combination with an aqueous source of chlorine to the surface to be polished while simultaneously mechanically polishing the surface.

17 Claims, 1 Drawing Figure

U.S. Patent   Sept. 7, 1976   3,979,239
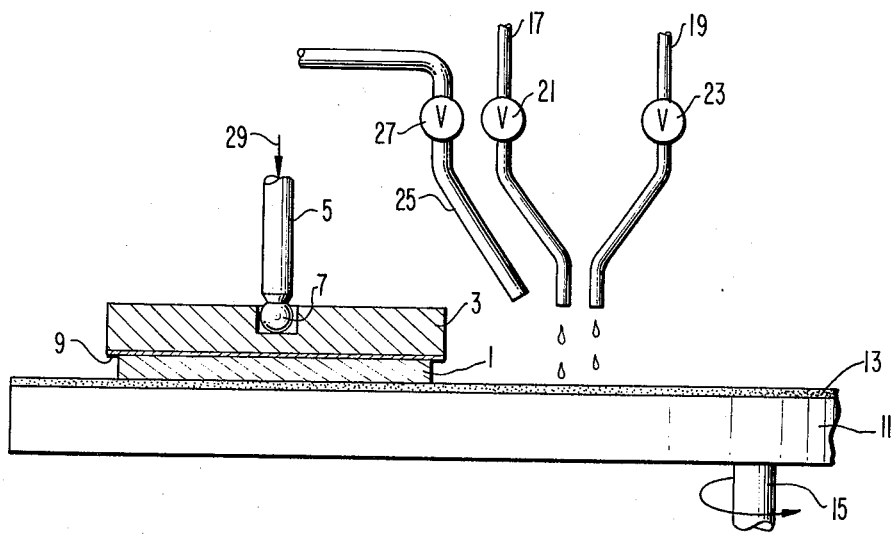

PROCESS FOR CHEMICAL-MECHANICAL POLISHING OF III-V SEMICONDUCTOR MATERIALS

BACKGROUND OF THE INVENTION

1. Field of the Invention

This invention relates to the polishing of semiconductor planar surfaces using a combined mechanical polishing and chemical etching treatment. More particularly, the present process relates to the rapid polishing of planar surfaces of III - V semiconductors to provide smooth, highly polished surfaces. A high rate of polishing is obtained with wafers and slices of III - V materials such as GaP, GaAs, GaAsP, InAs and the like. 2. Description of the Prior Art A substantial volume of prior art has been generated in recent years relating to the chemical and mechanical polishing of semiconductor surfaces. As is well known, III – V compounds are used as the basic semiconductor portion of several types of devices, the most common being light emitting diodes. In many such devices, regular, smooth planar surfaces within close tolerances are required. In addition, the surfaces in question often must be characterized by substantial "flatness", or uniform surface angle with respect to a fixed reference plane.

Mechanical procedures and apparatus for polishing planar semiconductor surfaces are known in the art. For example, the semiconductor wafer or slice is attached to a mounting block, carried by a freely rotatable spindle. Then the semiconductor surface is pressed against a moving polishing surface, such as a polyurethane polishing cloth carried by a driven turntable. A commercially available device which can be used to mechanically polish semiconductor wafers or slices is the Geoscience PA-100 laboratory polisher available from Geoscience, Inc. of Mount Vernon, N.Y.

In order to rapidly polish semiconductor devices chemical etchants are employed in combination with mechanical polishing. The chemical etchant can be selected to react with the semiconductor surface to form a product more easily removed from the surface by the mechanical polisher. However, the etchant is often not selected from those which strongly attack the semiconductor compounds since an undesired rough or pitted surface could result.

Chemical etchant systems are described in the following publications and patents:

The Journal of the Electrochemical Society, 109, 880 (1962) contains an article by Fuller & Allison entitled "A Polishing Etchant for III – V Semiconductors" describing the employment of an etchant consisting basically of an organic liquid in which a halogen, generally $Cl_2$ or $Br_2$, is dissolved. Methyl alcohol and glacial acetic acid in a "dry" state are described as preferred organic liquids. Fuller and Allison state "adding water slows the etching reaction." The etchant is described as being suitable for GaAs and GaP crystals. For GaP, $Br_2$ is noted as being "too slow", the best procedure being to immerse the specimen in methyl alcohol through which chlorine gas is slowly bubbled. This reference also states that aqua regia (nitrohydrochloric acid) is an etchant for the III – V surfaces but is undesirable for a number of reasons. Organic solutions of bromine or chlorine are recognized by the artisan as presenting hazards due to the possibility of violent reaction.

Oldham, "Chemical Polishing of GaP" at page 57 of the Jan.–Feb. 1965 Electrochemical Technology, describes a mechanical-chemical polishing technique employing a viscous mixture of a solution of methanol saturated with chlorine and an equal volume of $H_3PO_4$. The GaP sample is attached to a Teflon disk which glides against a glass disk immersed in the etchant.

Reisman and Rohr, "Room Temperature Chemical Polishing of Ge and GaAs". Journal of the Electrochemical Society, Vol. III, No. 12, 1 and 25, employ NaOCl in aqueous solution to etch the semiconductor surfaces in combination with mechanical polishing techniques. The reaction of NaOCl with the chloride in an acidified solution to form free chlorine and water is recognized as an analytical tool to determine available chlorine content.

Basi U.S. Pat. No. 3,775,201 is directed to mechanical-chemical polishing of GaP wafers with alkali metal oxybromide with or without a base. The etchant employed is described as being specific for GaP surfaces. The base is described as a solvent for the $GaPO_4$ formed by reaction of GaP with NaOBr. Standard polishing equipment is described as being illustrated in U.S. Pat. No. 3,342,652. Basi '201 states that the process described in Basi Pat. No. 3,738,882 is inoperable for polishing GaP.

U.S. Pat. No. 3,738,882 to Basi is directed to a semiconductor mechanical-chemical polishing process specific for GaAs. The chemical etchant is a combination of sodium hypochlorite and sodium carbonate in aqueous solution. The chemical reaction involving hypochlorite is stated by Basi to be as follows:

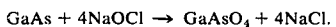

$$GaAs + 4NaOCl \rightarrow GaAsO_4 + 4NaCl.$$

The U.S. Pat. No. 3,738,882 patent recognizes the prior art of U.S. patent No. 3,342,652 to Reismann et al as disclosing the use of aqueous sodium hypochlorite and potassium hypochlorite solutions as oxidizing agents in the polishing of gallium arsenide. Basi states "This teaching only discloses the use of very dilute solutions of sodium and potassium hypochlorite, which are useful for polishing gallium arsenide, and illustrates that higher concentrations are deleterious in that they produce oxidized and pitted surfaces upon the wafer or slice." "It has been reported that higher concentrations" (above the 1.25 to 2.4 grams per liter described for U.S. Pat. No. 3,342,652) "of sodium hypochlorite produce pitted surfaces and the polishing rate even using dilute solutions is only in the magnitude of 0.7 to 2 mils per hour."

SUMMARY OF THE INVENTION

An object of this invention is to provide an improved method for mechanical-chemical polishing the surfaces of III – V semiconductor compounds.

Another object of this invention is to provide an etchant system usable in semiconductor mechanical-chemical polishing systems for any III – V semiconductor compound, for example GaP, GaAs, GaAsP and InAs planar surfaces.

A further object of this invention is to provide a rapid process for polishing III – V semiconductor wafers or slices to a high order of surface perfection.

Another object of this invention is to provide a process for polishing III – V semiconductor surfaces which does not involve the use of potentially dangerous chemicals or reactions.

The above and other objects of this invention are accomplished by providing a process for polishing surfaces of III – V semiconductor compounds, said process comprising the application of an etchant consisting of a solution of a compound yielding free chlorine in an acidic environment to the semiconductor surface while mechanically polishing the surface, and maintaining said acidic environment.

More particularly, a weak aqueous solution of hydrochloric acid or equivalent thereof is combined with or applied as a separate stream with an aqueous solution of the compound providing free chlorine upon acidification thereof, and the treating liquid is continuously or intermittently applied to the surface of the semiconductor compound while it is being polished between two surfaces in relative movement with respect to one another.

In certain embodiments, an aqueous hydrochloric acid solution of about 0.5 to 2 weight %, preferably about 1.25 weight %, and an aqueous solution of about 0.5 to 5 weight %, preferably about 3 weight %, alkali metal hypochlorite are applied under mixing conditions to the surface of a polishing turntable, at least a portion of which is in polishing contact with the semiconductor device. Preferably, a defined pressure is applied to press the device to be polished against the turntable during the polishing procedure. Weight percent is defined herein as weight per weight and all percentages herein are in weight percent.

BRIEF DESCRIPTION OF THE DRAWING

The only FIGURE of the drawing is a cross-sectional view of an apparatus suitable for carrying out the present invention.

DETAILED DESCRIPTION OF THE INVENTION

One or more planar surfaces of III – V semiconductor wafers or slices must be polished to a high degree of surface smoothness and regularity for use in a number of processes and applications. As is well known, III – V semiconductor materials are composed of one or more elements of Group III and Group V of the periodic table. Examples of III – V semiconductor compounds are GaP, GaAs, GaAsP, InAs, and the like. The polished wafers or slices can be used as growth substrates, can be directly employed in the manufacture of diodes, transistors, and the like.

As disclosed above, the chemical mixture employed in the practice of the present invention may be generically described as an aqueous acidified solution of a compound providing free chlorine under acidic conditions. Although the two solutions to form the chemical mixture could be mixed prior to use, as a practical matter the two solutions are applied separately to the polishing apparatus in a manner to mix with one another as the polishing procedure is being carried out. The reason is that the solubility of chlorine in water is limited; hence the premature mixing would result in a solution of low chlorine content and also present a hazard due to liberation of free chlorine. The treating "solution" of the present invention (actually, a mixture of the two components a short time prior to application or simultaneous application of the two components) is believed to be characterized by a chlorine content above the chlorine gas concentration which can normally be obtained by dissolving chlorine in water at ambient temperature and pressure.

Thus, this invention utilizes an etchant formed from an aqueous acid component and a second component which is an aqueous solution of a compound providing free chlorine under acid conditions.

The acid component is preferably an aqueous solution of hydrochloric acid, 0.5 to 2% concentration, preferably about 1.25% concentration. Other aqueous acid components employing other acids which will provide about the same acid equivalent (calculated on the basis of normality) are operable. However, care should be taken in not selecting an acid which could deleteriously interfere with the production of a smooth polished surface. Sulfuric, nitric and perhaps other acids could be used to supply the necessary acidity. The pH of the treating solution will be at least 5 or below.

The second component of the etchant is an aqueous solution of a compound providing free chlorine when contacted with the first acid component. Preferably such compound is an inorganic compound, such as alkali metal oxychloride, or it can be an organic chlorine compound. Sodium hypochlorite is readily available. The potassium salt could also be used. Since sodium hypochlorite (NaOCl) is prepared in such a manner that there is always one mol of NaCl present for each mol of NaOCl, upon acidification free chlorine is generated.

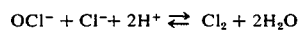

As suitable organic compounds which can be employed, there may be mentioned chlorinated cyanuric acids sold by Monsanto under the trademark "ACL". Although trichloro cyanuric acid can be employed, its solubility in water prior to acidification is rather limited. A suspension prior to acidification can be employed. The cyanuric acid salt of the following formula having greater solubility in water is preferable:

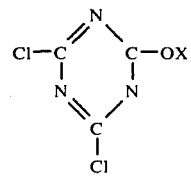

wherein X is an alkali metal such as potassium.

The concentration of the compound providing free chlorine in the second aqueous component can vary considerably, say about 0.5 to 5.0 per cent, perferably about 3 per cent, by weight.

Other inorganic or organic compounds containing chlorine will be apparent to the skilled artisan.

The two aqueous components are used at appropriate flow rates to provide the etching action. Some routine experimentation may be required to obtain optimum results depending upon selected concentration, pressure, polishing pad, relative speed between surfaces and the like. Within the broad concentration expressed above, the two components can be applied in ratio of about 1 : 2 to 2 : 1 (first component to second) preferably in about equal volumes, at a rate of about 50 to 100 milliliters per minute per square inch of wafer or slice surface area.

With the use of the preferred alkali metal oxychlorites or dichlorocyanuric acid salt, both of which produce OCl⁻ ions in aqueous solution, it is theorized that one or more of the following chemical reactions may be involved in the generation of the active etchant and reaction thereof with the Group III - V compound, using GaP as an example.

A. Etchant generation possibilities.

1. $OCl^- + 2H^+ + Cl^- \rightleftarrows Cl_2 + H_2O$

2. $2OCl^- + 2H^+ \rightleftarrows Cl_2O + H_2O$

B. Etching reaction

1. $GaP + 3Cl_2 + 3H_2O \rightarrow GaCl_3 + H_3PO_3 + 3HCl$

2. $2GaP + 3Cl_2O + 3H_2O \rightarrow 2GaCl_3 + 2H_3PO_3$.

It is reiterated that the above are only suspected mechanisms and applicant does not intend to be bound by any particular mechanism in explaining the results achieved.

The only FIGURE of the drawing illustrates in cross section one apparatus suitable for use in practicing the present invention. A III - V semiconductor wafer 1 is placed under pressure block 3 carried by freely rotatable spindle 5 rotatable about pivot 7. A retention pad 9 for protection and for preventing slippage between the pressure block and wafer is positioned between the wafer and the block. Turntable 11 carrying a fixed polishing pad 13 is driven by a motor (not shown) about spindle 15. Thus, the turntable and wafer rotate in the same direction. The aqueous acid component and aqueous chlorine-providing component are metered onto the polishing pad through supply lines 17 and 19, respectively. Valves 21 and 23 are used to control relative flow rates. Rinse water can be supplied to the turntable through line 25, flow being regulated by valve 27.

Preferably, during the process of this invention, a positive pressure is applied through the wafer normal to the turntable, as indicated by arrow 29. The pressure may range from about 1 to 100, preferably about 1 to 10, most preferably about 2 to 3 pounds per square inch of wafer surface area in contact with the turntable.

Temperature of the aqueous solution employed as well as temperature of the surrounding atmosphere is not critical and will generally be about normal room temperature, i.e., about 20° – 25°C.

Retention pad 9 can be any pad providing sufficient friction between the pressure block and the wafer. Rayon cloths have been found to be particularly suitable. The retention pad 9 as well as polishing pad 13 are selected so as to be essentially inert to the treating solutions, i.e. not overly prone to oxidation in a heavily oxidizing environment, while providing the necessary abrasive quality. With this under consideration, suitable polishing pads are constructed of nylon and rayon fabrics, felts such as wool felts, cellulosic fabrics and microporous polyurethane. The latter has been found to be particularly effective as a polishing pad.

The following examples are presented to illustrate the invention:

Example 1

| Machine: | Geoscience PA-100 ten-inch laboratory polisher equipped with pneumatic loading system |
| --- | --- |
| Polishing Pad: | CeO$_2$ filled polyurethane foam |
| Speed: | 335 RPM |
| Slices: | <100> GaP approximately 0.4 – 0.5 in$^2$ |
| Mounting Pad: | Rayon Cloth |

| | Concentration of Cl compound Chlorinated cyanuric acid | Concentration of HCl | Load (lb) | Number of Slices Tested | Stock Removal in 3 Min. Run (mils) (Average) |
| --- | --- | --- | --- | --- | --- |
| A | 0.33% | 0.37% | 31 | 3(pol)* | 0.05 |
| B | 0.33% | 0.37% | 31 | 1 | 0.10 |
| C | 0.33% | 0.74% | 31 | 1 | 0.09 |
| D | 0.50% | 0.37% | 31 | 1 | 0.12 |
| E | 1.00% | 1.10% | 31 | 1 | 0.28 |
| F | 0.90% | 1.30% | 39 | 3 | 0.30 |
| G | 0.90% | 1.30%(2) | 39 | 3 | 0.21 |
| H | 1.00% | 1.85% | 16 | 3 | 0.39 |
| I | 5% | | 39 | 3(pol) | 0.033 |
| J | 2%(1) | 2%(3) | 24 | 3(sawed) | 0.86 |

(1)NaOCl instead of chlorinated cyanuric acid
(2)After 15 minutes storage
(3)Fed to polishing plate as two separate streams at approximately equal flow rates of 80 milliliters per minute.
*pol means polished surface In runs A through H, the chlorine-containing compound used was "ACL 85", which is trichlorocyanuric acid. In run I, potassium dichlorocyanuric acid was employed. This illustrates that when the freely soluble compound of the second component is used alone, even in a relatively high concentration, removal rate is relatively low. In all runs except G and J, the two components were mixed immediately prior to application to the turntable. Run G as compared to run F illustrates the need for either fresh mixing or application of separate streams.

EXAMPLE 2

A thin, unlapped wafer of GaP sliced from a monocrystalline boule of GaP is placed under the pressure block of the apparatus of the drawing. The wafer retention surface is constituted by rayon cloth having rayon fibers bonded to a twill backing such as the rayon cloth sold under the trademark "Microcloth". The pressure is 2.5 lbs. per square inch of wafer upper surface area. The polishing pad is constituted by a polyurethane foam pad of .040 in (1mm) thickness such as sold under the trademark "Unalon LP-66". The turntable is rotated at approximately 240 rpm (causing the wafer block to rotate at about 260 rpm) while the NaOCl and HCl solutions are flowed in separate streams onto the turntable. The HCl concentration is about 1.25%. The NaOCl concentration is about 3%. The wafer stock removal rate under these conditions is about 1 mil (0.0254 mm) per minute. The HCl solution optionally may be terminated about 45 sec. before terminating polishing in order to provide a buffing effect for a highly-polished surface. After a total polishing time of 1 – 3 min., all streams are shut off and rinse water is turned on. Rotation of the polishing turntable is then stopped. Flow rates are 160 ml. per minute for the HCl solution and 180 ml. per minute for the NaOCl solution.

What I claim is:

1. A process for polishing a surface of a III - V semiconductor compound, comprising mechanically polishing said surface while applying thereto in an acid environment an etchant concentration of an aqueous solution of a compound which yields free chlorine under acid conditions.

2. The process of claim 1 wherein (A) an aqueous solution of an acid and (B) an aqueous solution of an alkali metal hypochlorite, an aqueous solution of a chlorinated cyanuric acid or salt thereof, or mixtures thereof, are combined to form said etchant in an acid environment.

3. The process of claim 2 wherein said solutions are applied as separate streams and mixed during said mechanical polishing.

4. The process of claim 3 wherein sodium hypochlorite or potassium hypochlorite is used, and wherein said acid is hydrochloric acid.

5. The process of claim 3 wherein trichlorocyanuric acid is used.

6. The process of claim 3 wherein the alkali metal salt of dichlorocyanuric acid is used.

7. The process of claim 4 wherein the concentration of the aqueous hydrochloric acid solution is about 0.5 to about 2 weight %.

8. The process of claim 5 wherein the concentration of the aqueous hydrochloric solution is about 0.5 to 2 weight %.

9. The process of claim 6 wherein the concentration of the aqueous hydrochloric acid solution is about 0.5 to 2%.

10. The process of claim 7 wherein the concentration of the aqueous sodium or potassium hypochlorite solution is about 0.5 to 5.0%.

11. The process of claim 10 wherein the hydrochloric acid is used in a concentration of about 1.25% and the sodium hypochlorite or potassium hypochlorite is used in a concentration of about 3%.

12. The process of claim 8 wherein the cyanuric acid or salt thereof is used in a concentration of about 0.5 to 5.0%.

13. The process of claim 12 wherein the hydrochloric acid is used in a concentration of about 1.25% and the potassium dichlorocyanuric acid is used in a concentration of about 3.0%.

14. The process of claim 10 wherein said mechanical polishing is carried out by providing a relative motion between said surface and a polishing surface while applying a pressure of about 1 to 100 pounds per square inch of said surface to press the surface against said polishing surface.

15. The process of claim 12 wherein said mechanical polishing is carried out by providing a relative motion between said semiconductor surface and a polishing surface while applying a pressure of about 1 to 100 pounds per square inch of said surface to press said semiconductor surface against said polishing surface.

16. The process of claim 10 wherein the flow rates of the hydrochloric acid and hypochlorite solution are 50 to 100 milliliters per minute per square inch of said surface.

17. The process of claim 12 wherein the flow rates of the hydrochloric acid and cyanuric salt or acid solutions are 50 to 100 milliliters per minute per square inch of said surface.

* * * * *